United States Patent
Chi

(10) Patent No.: US 6,500,706 B1
(45) Date of Patent: Dec. 31, 2002

(54) BIT-LINE INTERCONNECTION SCHEME FOR ELIMINATING COUPLING NOISE IN STACK DRAM CELL WITH CAPACITOR UNDER BIT-LINE (CUB) IN STAND-ALONE OR EMBEDDED DRAM

(75) Inventor: Min-Hwa Chi, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/809,834

(22) Filed: Mar. 19, 2001

(51) Int. Cl.[7] .......................................... H01L 21/8242
(52) U.S. Cl. ...................... 438/239; 438/253; 257/776; 257/304
(58) Field of Search ................................. 257/776, 304, 257/296, 906, 907, 908; 438/239, 253; 365/69, 210, 63

(56) References Cited

U.S. PATENT DOCUMENTS

| | | | | |
|---|---|---|---|---|
| 5,014,110 A | * | 5/1991 | Satoh | 357/68 |
| 5,107,459 A | * | 4/1992 | Chu et al. | 365/63 |
| 5,170,243 A | * | 12/1992 | Dhong et al. | 365/208 |
| 5,625,585 A | | 4/1997 | Ahn et al. | 365/63 |
| 5,700,731 A | | 12/1997 | Lin et al. | 438/381 |
| 5,864,181 A | * | 1/1999 | Keeth | 257/776 |
| 5,893,734 A | | 4/1999 | Jeng et al. | 438/239 |
| 6,048,767 A | | 4/2000 | Terada | 438/262 |
| 6,064,589 A | * | 5/2000 | Walker | 365/149 |
| 6,084,307 A | * | 7/2000 | Keeth | 257/776 |
| 6,121,086 A | * | 9/2000 | Kuroda et al. | 438/256 |
| 6,140,704 A | | 10/2000 | Kang et al. | 257/773 |
| 6,333,866 B1 | * | 12/2001 | Ogata | 365/63 |

OTHER PUBLICATIONS

L. Chang et al., "A New DRAM Cell Structure with Capacitor–Equiplanar–to–Bitline (CEB) for Bitline Coupling Noise Elimination", 1998 International Conference on Solid–State and Integrated–Circuit Technology (ICSICT'98), pp. 428–431, Oct. 1998).

K.Kim et al., "DRAM Technology Perspective for Gigabit Era," IEEE Trans. Electron Devices, V. 45, No. 3, pp. 598–608. 1998.

K. Itoh et al., "Limitations and Challenges of Multigigabit DRAM Chip Design", IEEE Journal of Solid–State Circuits, V. 32, No. 5, pp. 624–634, 1997.

D.Min et al., "Twisted Bit–Line Techniques for Multigigabit DRAMs", IEE Electronics Letters, V. 33, No. 16, pp. 1380–1382, 1997.

H. Hidaka et al., "Twisted Bit–line Architectures for Multi–Megabit DRAMs", IEEE Journal of Solid–State Circuits, V. 24, No. 1, pp. 21–27, 1989.

* cited by examiner

Primary Examiner—Wael Fabrny, Jr.
Assistant Examiner—Fernando Toledo
(74) Attorney, Agent, or Firm—George O. Saile; Stephen B. Ackerman; Rosemary L. S. Pike

(57) ABSTRACT

A method for forming a stack DRAM cell with CUB wherein coupling noise is eliminated is described. Bit-lines are formed according to one of three methods. In a first method, a first pair of bit-lines is fabricated in a first metal layer and a second pair of bit-lines is fabricated in a second metal layer separated from the first metal layer by an insulating layer wherein the first pair of bit-lines is horizontally spaced from the second pair of bit-lines. In a second method, a first of each pair of bit-lines is fabricated in a first metal layer and a second of each pair of bit-lines is fabricated in a second metal layer separated from the first metal layer by an insulating layer wherein the first of each pair of bit-lines is horizontally spaced from the second of each pair of bit-lines. In a third method, each bit-line is divided into segments. First segments of a bit-line are fabricated in a first metal layer and alternating segments of the bit-line are fabricated in a second metal layer separated from the first metal layer by an insulating layer wherein for each pair of bit-lines, facing segments of a first and second of the bit-line pair are fabricated in different metal layers wherein the first of each pair of bit-lines is horizontally spaced from the second of each pair of bit-lines.

25 Claims, 6 Drawing Sheets

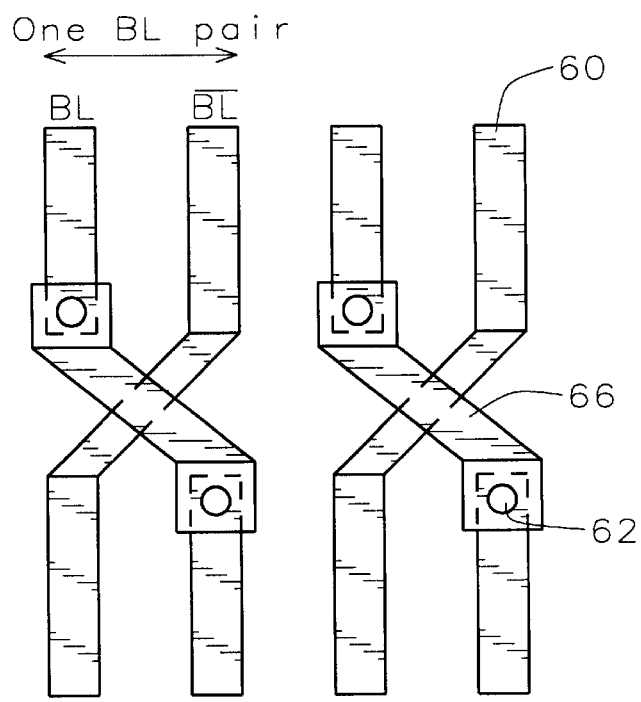
FIG. 4 *Prior Art*
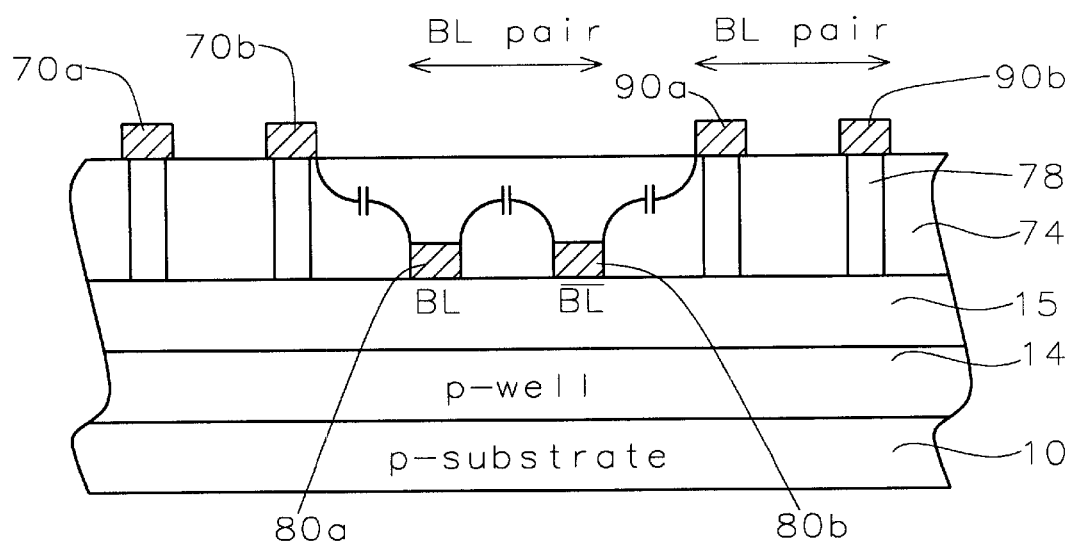
FIG. 5

BIT-LINE INTERCONNECTION SCHEME FOR ELIMINATING COUPLING NOISE IN STACK DRAM CELL WITH CAPACITOR UNDER BIT-LINE (CUB) IN STAND-ALONE OR EMBEDDED DRAM

BACKGROUND OF THE INVENTION (1) Field of the Invention

The present invention relates to the fabrication of integrated circuit devices, and more particularly, to a method of eliminating coupling capacitance between bit-lines in a stack DRAM cell with capacitor under bit-line (CUB) in the fabrication of integrated circuits.

(2) Description of the Prior Art

The popular 1-transistor (1T) dynamic random access memory (DRAM) cell is composed of a pass transistor (for switching) and a storage capacitor. The state-of-the-art DRAM cell has typically either a stacked capacitor or a trench capacitor; referred to as "stack cell" or "trench cell", respectively. Among stack cells, the capacitor can be fabricated either above or below the bit-line, referred to as Capacitor Over Bit-line (COB) or Capacitor Under Bit-line (CUB) structures. All of these cell structures are popular in current manufacture of 16 Mb and 64 Mb DRAM. U.S. Pat. No. 6,048,767 to Terada and U.S. Pat. No. 5,700,731 to Lin et. al. disclose COB schemes.

In integrated circuit manufacture, embedded dynamic random access (DRAM) devices have both memory cells and logic cells formed on a single silicon chip. The stack DRAM with CUB is preferred for embedded DRAM applications, since capacitors can be fabricated before logic transistors (for avoiding thermal cycle effect on logic transistors) and the metal bit-line can be shared with logic circuits. The conventional bit-lines of stack DRAM with CUB scheme are fabricated at the same metal level (e.g. M1) with minimum line and spacing design rules. U.S. Pat. No. 5,893,734 to Jeng et al discloses such a scheme. There is coupling capacitance within each bit-line pair (BL and BL-bar) as well as from adjacent bit-lines. The stack cell with CUB scheme indeed has drawbacks of larger bit-line to bit-line coupling noise (See "A New DRAM Cell Structure with Capacitor-Equiplanar-to-Bitline (CEB) for Bit-line Coupling Noise Elimination" by L. Chang et al, 1998 *International Conference on Solid-State and Integrated-Circuit Technology* (ICSICT'98), p. 428–431, October 1998) and larger cell size than the stack cell with COB scheme, based on the same design rules. For these reasons, the COB scheme is preferred by stand-alone or commodity DRAM (See "DRAM Technology Perspective for Gigabit Era" by K. Kim et al, *IEEE Transactions Electron Devices*, V. 45, No. 3, p. 598–608, 1998 and "Limitations and Challenges of Multi-gigabit DRAM Chip Design" by K. Itoh et al, *IEEE Journal of Solid-State Circuits*, V. 32, No. 5, p. 624–634, 1997), although the CUB scheme is preferred by embedded DRAM applications.

There are conventional ways for bit-line coupling noise reduction, e.g. using twisted bit-line. Some of these methods are disclosed in "Twisted Bit-line Techniques for Multi-gigabit DRAMs" by D. Min et al, *IEE Electronics Letters*, V. 33, No. 16, P. 1380, 1997 and "Twisted Bit-line Architectures for Multi-megabit DRAMs" by H. Hidaka et al, *IEEE Journal of Solid-State Circuits*, V. 24, No. 1, p. 35–42, 1989. U.S. Pat. No. 6,140,704 to Kang et al and U.S. Pat. No. 5,625,585 to Ahn et al show twisted bit-line layouts. One drawback of the twisted bit-line technique is its larger size for implementation. However, in the embedded DRAM process, multi-layer metal is available for both logic and DRAM. Thus, the bit-line inter-connect can utilize multi-level metal for no increase of process complexity. A new bit-line interconnect scheme is proposed in which bit-lines are fabricated in an alternating manner at multiple metal layers.

SUMMARY OF THE INVENTION

Accordingly, it is a primary object of the present invention to provide an effective and very manufacturable method for forming a stack DRAM cell with capacitor under bit-line (CUB) in the fabrication of integrated circuits.

It is a further object of the invention to provide a process for forming a stack DRAM cell with CUB wherein coupling noise is eliminated.

Another object is to provide a process for forming a stack DRAM cell with CUB for use in stand-alone or embedded DRAM wherein coupling noise is eliminated.

Yet another object is to provide a process for forming a stack DRAM cell with CUB wherein coupling noise is eliminated by alternating metal levels by bit-line pairs.

A further object is to provide a process for forming a stack DRAM cell with CUB wherein coupling noise is eliminated by alternating metal levels by each bit-line.

A still further object is to provide a process for forming a stack DRAM cell with CUB wherein coupling noise is eliminated by alternating metal levels within a bit-line.

Yet another object is to provide a process for forming a stack DRAM cell with CUB wherein coupling noise is eliminated by alternating metal levels by bit-line pairs with metal shielding between bit-lines.

Another further object is to provide a process for forming a stack DRAM cell with CUB wherein coupling noise is eliminated by alternating metal levels by each bit-line with metal shielding between bit-lines.

Another still further object is to provide a process for forming a stack DRAM cell with CUB wherein coupling noise is eliminated by alternating metal levels within a bit-line with metal shielding between bit-lines.

In accordance with the objects of the invention, a method for forming a stack DRAM cell with CUB wherein coupling noise is eliminated is achieved. A capacitor node contact junction and a plurality of bit-line junctions are provided in a semiconductor substrate. A capacitor is formed overlying the semiconductor substrate and connected to the capacitor node contact junction by a contact plug through a first insulating layer. A second insulating layer is deposited overlying the capacitor. A plurality of metal plugs is formed through the second and first insulating layers each contacting one of the plurality of bit-line junctions. Now, bit-lines are formed according to one of three methods.

In a first method, bit-lines are formed each contacting one of the plurality of metal plugs wherein a first pair of bit-lines is fabricated in a first metal layer overlying the second insulating layer and wherein a second pair of bit-lines is fabricated in a second metal layer separated from the first metal layer by a third insulating layer and wherein the second pair of bit-lines contacts one of the metal plugs by a via plug through the third insulating layer and wherein the first pair of bit-lines is horizontally spaced from the second pair of bit-lines.

In a second method, bit-lines are formed, each contacting one of the plurality of metal plugs wherein a first of each pair of bit-lines is fabricated in a first metal layer overlying the second insulating layer and wherein a second of each pair of bit-lines is fabricated in a second metal layer separated from the first metal layer by a third insulating layer and wherein the second of each pair of bit-lines contacts one of the metal plugs by a via plug-through the third insulating layer and wherein the first of each pair of bit-lines is horizontally spaced from the second of each pair of bit-lines.

In a third method, bit-lines are formed, each contacting one of the plurality of metal plugs wherein each bit-line is divided into segments and wherein first segments of a bit-line are fabricated in a first metal layer overlying the second insulating layer and wherein alternating segments of the bit-line are fabricated in a second metal layer separated from the first metal layer by a third insulating layer and wherein for each pair of bit-lines, facing segments of a first and second of the bit-line pair are fabricated in different metal layers and wherein the segments of each bit-line in the second metal layer contact one of the metal plugs by a via plug through the third insulating layer and wherein the first of each pair of bit-lines is horizontally spaced from the second of each pair of bit-lines. This completes fabrication of a DRAM with capacitor under bit-line (CUB) cell in an integrated circuit device.

BRIEF DESCRIPTION OF THE DRAWINGS

In the accompanying drawings forming a material part of this description, there is shown:

FIG. 4 is a top view of view 4—4 of FIG. 3.

FIG. 5 is cross-sectional representation of a first preferred embodiment of the present invention.

DESCRIPTION OF THE PREFERRED EMBODIMENTS

Figure 1:
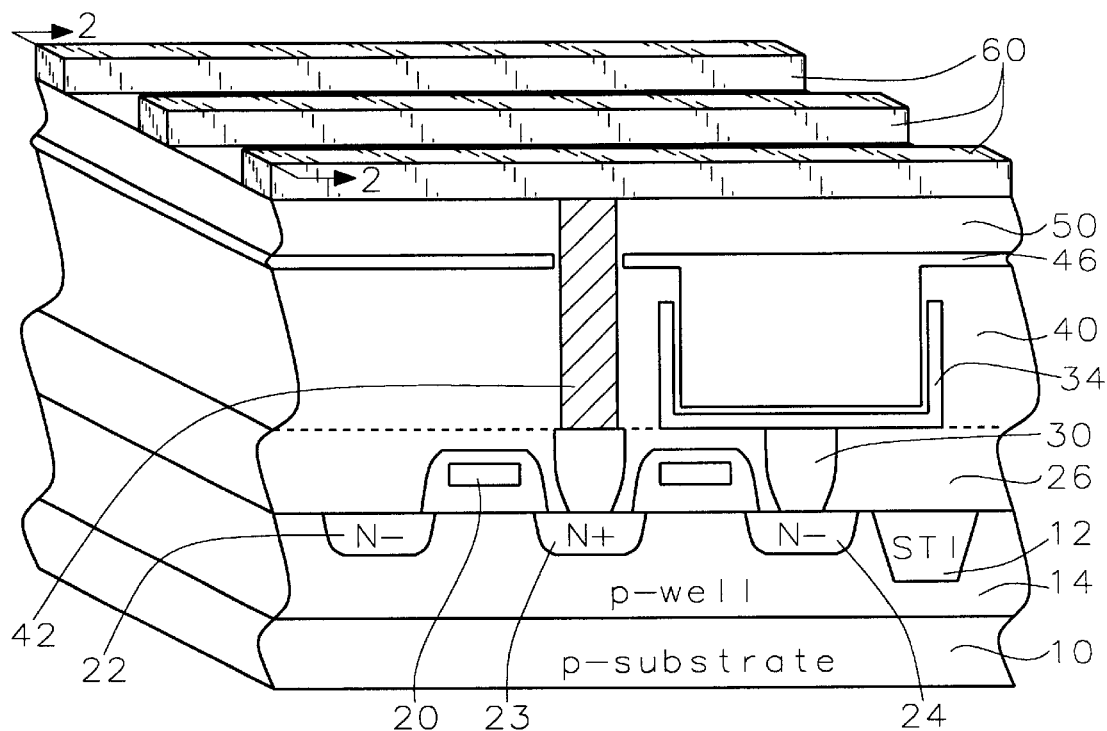
FIG. 1 is a cross-sectional representation of a DRAM with CUB of the prior art.

A new bit-line scheme is proposed herein where bit-lines are fabricated in alternating manner at multiple metal layers. In this way, bit-lines are separated from each other more than in conventional bit-lines on the same metal level. This greatly reduces both intra- and inter-bit-line coupling. The bit-line coupling can be further eliminated if an extra metal layer is inserted between bit lines for electrical shielding.

In a first preferred embodiment of the present invention, each pair of bit-lines is fabricated at high and low metal levels in an alternating manner with stacked via plugs connecting bit-line metal to bit-line junctions. This embodiment will be described with reference to FIG. 5.

In a second preferred embodiment, each bit-line is fabricated at high and low metal levels in an alternating manner with stacked via plugs connecting bit-line metal to bit-line junctions. This embodiment is described with reference to FIG. 6.

In a third preferred embodiment, each bit-line is divided into segments fabricated using high and low metal layers. The complementary bit-line in each pair is fabricated similarly, but staggered so that the same segments will not be facing each other directly at the same metal level. This embodiment is described with reference to FIG. 7.

In a fourth preferred embodiment, to further eliminate coupling capacitance, an additional metal layer for shielding can be inserted in between bit-lines at high and low metal layers in each of the first, second, and third embodiments. This embodiment is described with reference to FIGS. 9A–9C.

It will be understood by those skilled in the art that the invention is not limited to the embodiments shown in FIGS. 5–9, but that the invention can be applied and extended to other embodiments. For example, the process of the invention can be applied to both stand-alone and embedded DRAM with CUB.

The capacitor under bit-line (CUB) is preferred for embedded CRAM applications since capacitors can be fabricated before logic transistors, thus avoiding thermal cycle effects on the logic transistors, and the metal bit-line can be shared with metal-1 in the logic area. One of the popular CUB stacked cells for DRAM at the 0.18 μm design rule and beyond is the crown type cell, shown in FIG. 1 (not to scale). The word-line 20 of pass transistors is preferably polycide (e.g. tungsten silicide). The bottom electrode 34 is heavily doped polysilicon and is connected to the lightly doped n– junction 24 through a polysilicon plug 30. The poly plug is lightly doped to avoid heavy doping diffused into the n– junction. The top electrode 46 of the capacitor is often heavily doped. The bit-line 60 is preferably metal; for example, tungsten or aluminum; and is connected to the N+ bit-line junction 23 through polysilicon plug 30 and tungsten plug 42. First oxide layer 26 is typically 1000 to 2000 Angstroms in thickness, second oxide layer 40 is typically 8000 to 14,000 Angstroms in thickness, and third oxide layer 50 is typically 1000 to 2000 Angstroms thick. The second oxide thickness determines the height of the capacitor and therefore the magnitude of the cell capacitance.

Figure 2A:
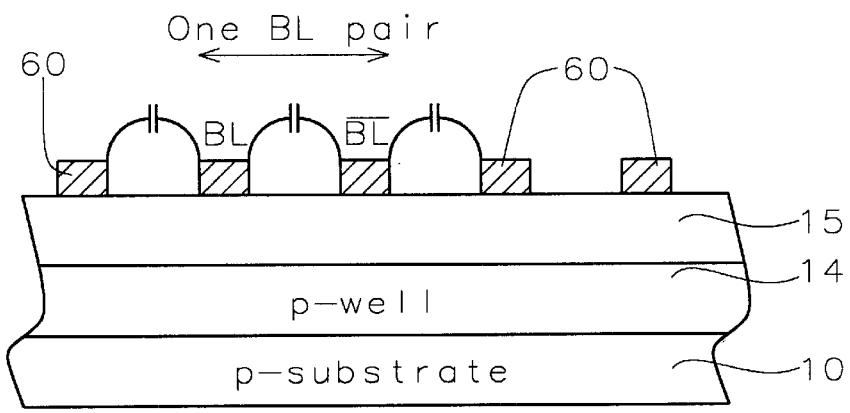
FIGS. 2A is a cross-sectional representation and FIG. 2B is a top view of the bit lines shown in view 2—2 of FIG. 1.
Figure 2B:
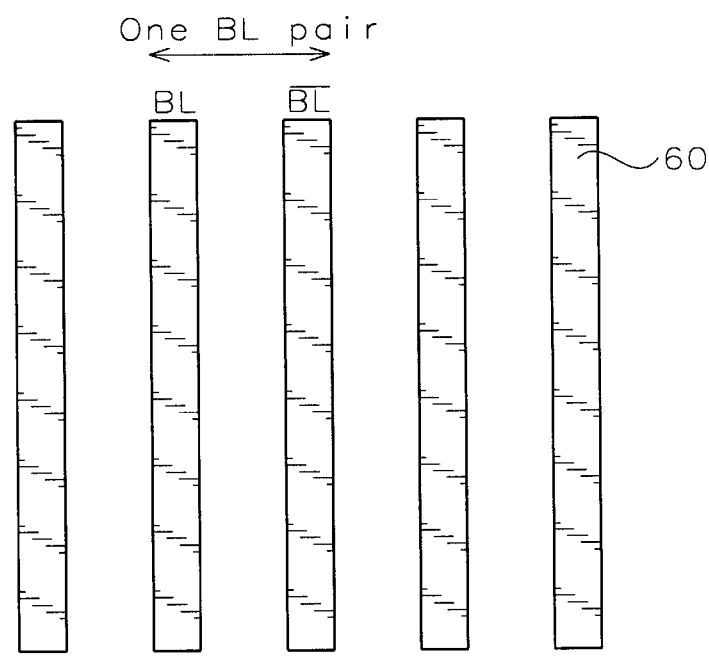

The conventional bit-lines of stack DRAM with CUB are fabricated at the same metal level (for example, metal-1 as shown in FIG. 1) with minimum line and spacing design rules. FIG. 2A shows cross-section 2A—2A of FIG. 1. FIG. 2B shows a top view of the bit-lines 60. There is coupling capacitance within each bit-line pair (BL and BL-bar) as well as from adjacent bit-lines. Note that STI 12, W-plug 42, poly plug 30, capacitor 34/46, and oxide 40 and 50 are not explicitly shown in the view in FIG. 2B, but they are included in the layer labeled 15.

Figure 3:
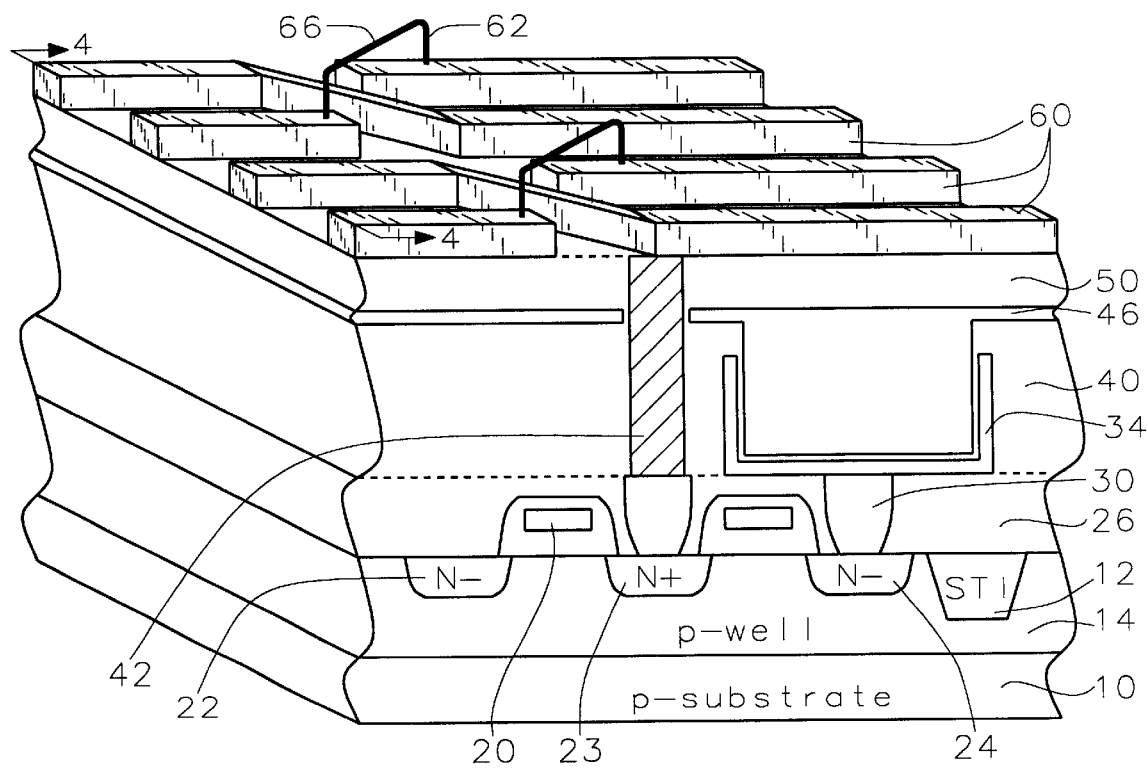
FIG. 3 is a cross-sectional representation of another DRAM with CUB of the prior art.

The bit-lines in a stack DRAM with CUB cell can be segmented and twisted, as shown in cross-section in FIG. 3 and in top view in FIG. 4, using additional metal layers. In this way, the effect of the coupling noise through coupling capacitance of each segment is cancelled against each other. This twisted bit-line interconnection can be implemented on stand-alone DRAM at the cost of one extra metal layer, but it is "free" in embedded DRAM due to readily available multi-level metal layers. One drawback of the twisted bit-line technique is its larger size for implementation of twisted bit-lines. However, in the embedded DRAM process, multi-level metal layers (for example, up to 6 levels at the 0.18 μm generation) are readily available without increasing process complexity.

The present invention proposes new bit-line interconnect schemes in which bit-lines are fabricated in alternating manner at multiple metal layers. In this way, the effective distance between bit-lines is increased; therefore, the intraand inter-bit-line coupling is greatly reduced. The bit-line coupling can be eliminated further if an additional metal layer is inserted between bit-lines for electrical shielding. Note that there is no concept of twisted bit-lines in the present invention.

The bit-line to bit-line coupling noise is one of the most critical issues in DRAM cell design. The signal charge stored in the cell capacitor must be large enough so that the signals under the worst coupling conditions still can be sensed by the sense amplifier. If the bit-line coupling noise can be eliminated totally, then the charge stored in the cell capacitor may be decreased significantly (e.g. ~30% at 0.18 μm design rule).

A first preferred embodiment of the present invention will be described with reference to FIG. 5. The underlying layers, including word-lines and capacitor, are as shown in FIGS. 1 and 3 and are included in layer 15 in FIG. 5 for simplicity. Bit-lines are fabricated at different metal layers (e.g. M1 and M2) pair-by-pair as shown in FIG. 5. Stacked via plugs 78 connect bit-line metal to tungsten plug 42 (as in FIG. 1), poly plug 30, and bit-line junctions 23.

It will be understood that bit-line pairs can be fabricated in an alternating manner between more remote metal layers (e.g. M1 to M4 etc.) using stacked via plugs. FIG. 5 shows bit-line pair 80a and 80b formed of metal-1while bit-line pairs 70a and 70b and 90a and 90b are formed of metal-2 overlying oxide layer 74. The bit-line capacitance within each pair; that is, intra-bit-line; is the same as in the conventional scheme. For example, the capacitance between 70a and 70b is intra-bit-line capacitance. However, the bit-line capacitance from adjacent bit-lines (inter-bit-line) is reduced significantly. For example, the capacitance between 70b and 80a is inter-bit-line capacitance. The advantage of this scheme is a more symmetrical load of bit-lines of a pair to the sense amplifier.

Figure 6:
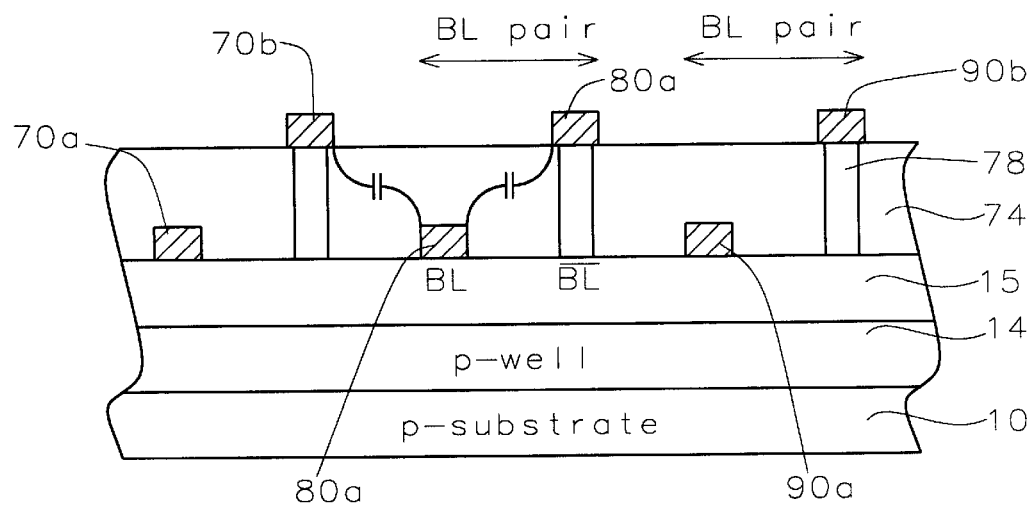
FIG. 6 is cross-sectional representation of a second preferred embodiment of the present invention.

Referring now to FIG. 6, a second preferred embodiment of the invention will be described. Bit-lines are fabricated at low and high metal levels (e.g. M1 and M2) in an alternating one-by-one manner with stacked via plugs 78 connecting bit-line metal to bit-line junctions 23 through W-plug and poly plug (not shown in FIG. 6, but included in layer 15). It will be understood that bit-lines can be fabricated in an alternating manner between more distant metal layers (e.g. M1 to M4 etc.) using stacked via plugs. FIG. 6 shows bit-lines 70a, 80a, and 90a formed of metal-1 while bit-lines 70b, 80b, and 90b are formed of metal-2 overlying oxide layer 74. The bit-line capacitance within each pair (for example between 70a and 70b) and from adjacent bit-lines (for example between 70b and 80a) are both reduced significantly over conventional bit-lines. The bit-line at the high metal level in each pair may have slightly larger resistance contributed by the vias or stacked vias than the bit-line at the low metal level; therefore the bit-line pair may not have such good symmetry to a sense amplifier as in the first embodiment.

Figure 7:
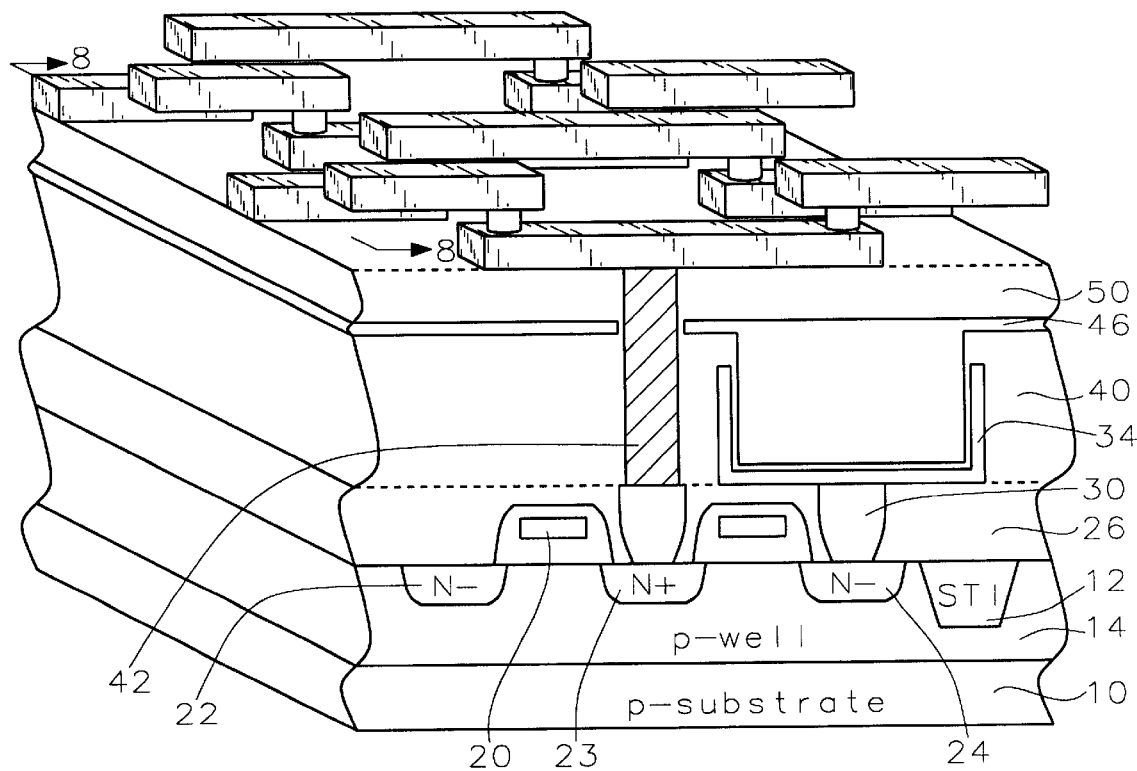
FIG. 7 is cross-sectional representation of a third preferred embodiment of the present invention.
Figure 8:
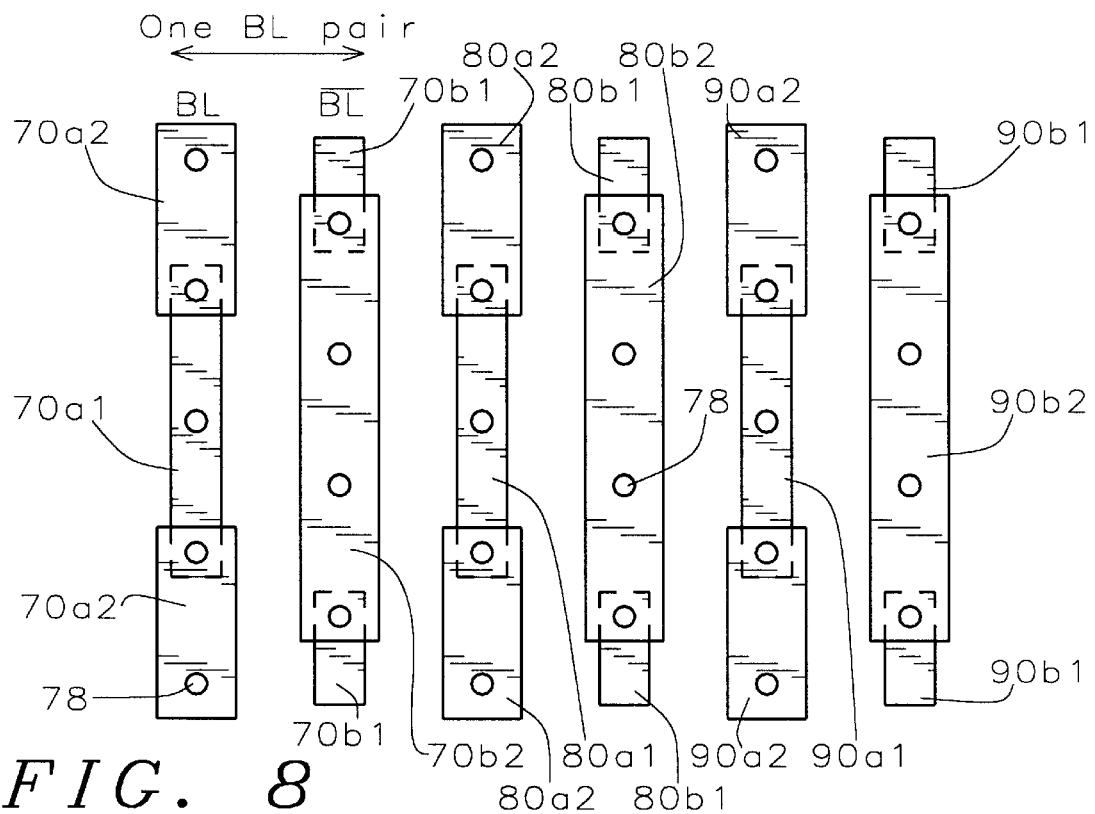
FIG. 8 is a top view of view 8—8 of FIG. 7.

To avoid the symmetry issue of the second embodiment, a third preferred embodiment divides each bit-line into segments of equal length. FIG. 7 illustrates a cross-section and FIG. 8 illustrates a top view of the bit-lines of the third embodiment. The bit-lines are fabricated using high and low metal layers. That is, bit-line segments are in an up and down manner. The complementary bit-line in each pair is fabricated similarly, but staggered so that the same segments will not be facing each other directly at the same metal level.

As shown in top view in FIG. 8, bit-line 70a has been divided into segments 70a1 comprising metal-1 and 70a2 comprising metal-2. Vias 78 connect the two metal layers. The complementary bit-line 70b has been divided similarly into segments 70b1 and 70b2. Note that the facing segments; e.g. 70a1 and 70b2; are not at the same level. The length of each segment can be designed to be longer or shorter.

In this way, both the inter- and intra-bit-line coupling is reduced and symmetry to a sense amplifier is preserved.

One way to further eliminate coupling capacitance is by inserting a metal layer for shielding in between bit-lines. This fourth embodiment can be applied to any of the first, second, and third embodiments.

Figure 9A:
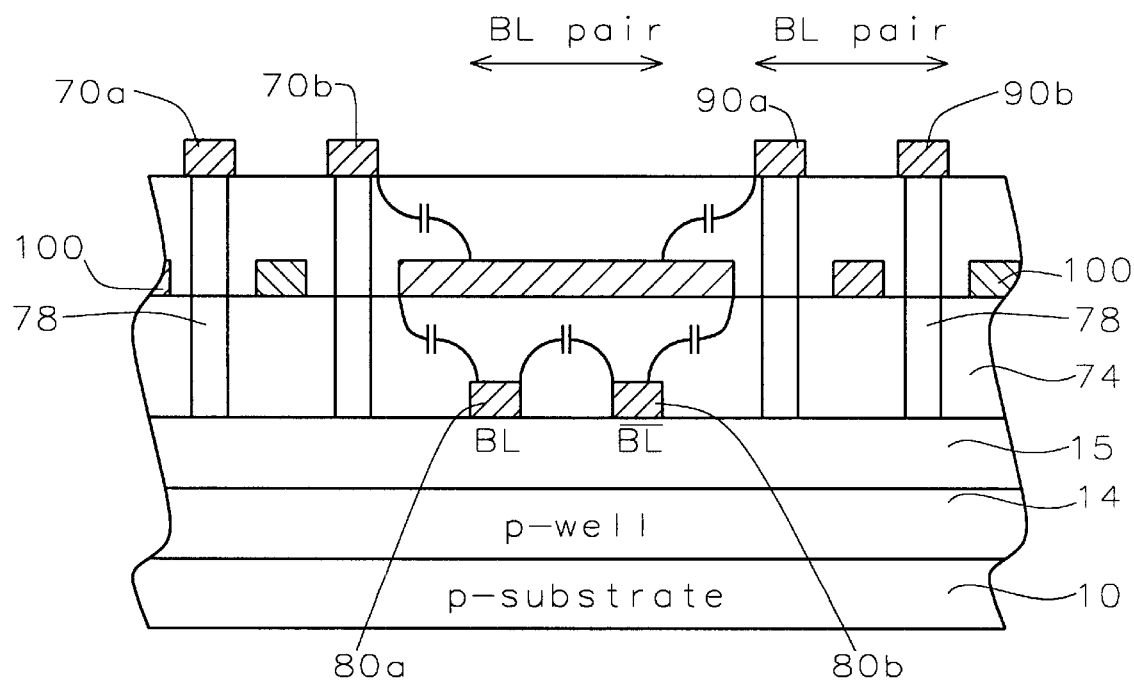
FIGS. 9A–9C are cross-sectional representations of three alternatives of a fourth preferred embodiment of the present invention.

FIG. 9A illustrates the insertion of an additional metal layer 100 between bit-lines in the first embodiment scheme. Bit-line pair 80a and 80b is fabricated in a low metal layer (e.g. metal-1) while bit-line pairs 70a and 70b and 90a and 90b are fabricated in a high metal layer (e.g. metal-3). The intervening metal line 100 in layer metal-2 provides a shielding layer to eliminate inter-bit-line coupling; for example, between 70b and 80a.

Figure 9B:
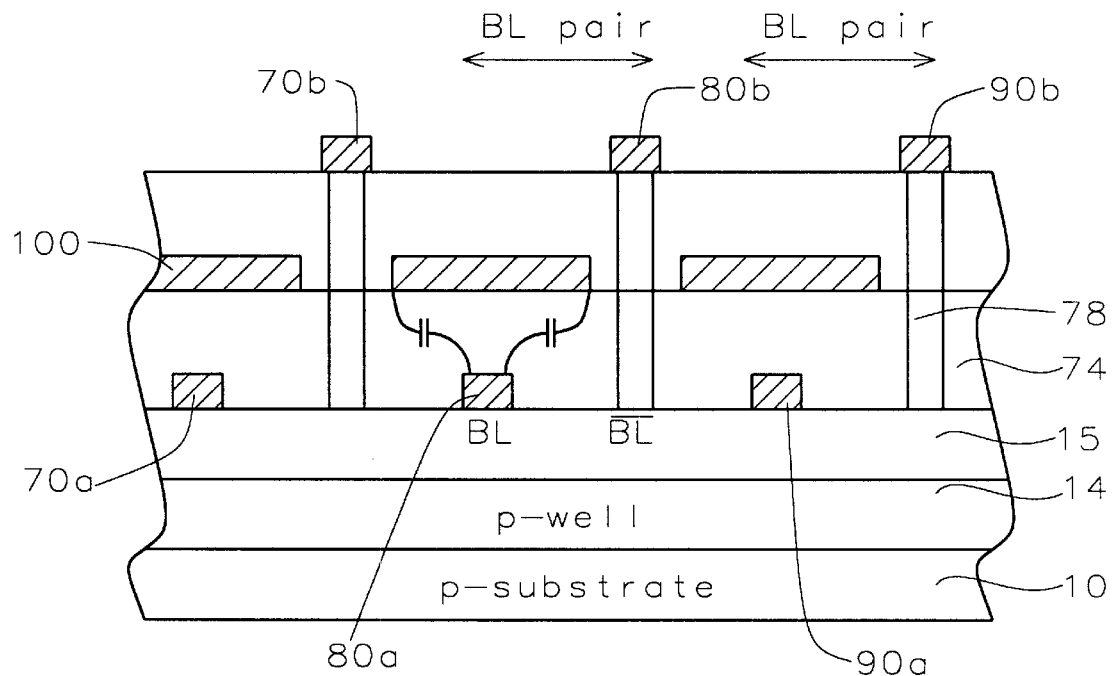

FIG. 9B illustrates the insertion of an additional metal layer 100 between bit-lines in the second embodiment scheme. Bit-lines 70a, 80a, and 90a are fabricated in a low metal layer (e.g. metal-1) while bit-lines 70b, 80b, and 90b are fabricated in a high metal layer (e.g. metal-3). The intervening metal line 100 in layer metal-2 provides a shielding layer to eliminate both intra- and inter-bit-line coupling; for example, between 70a and 70b and between 70b and 80a.

Figure 9C:
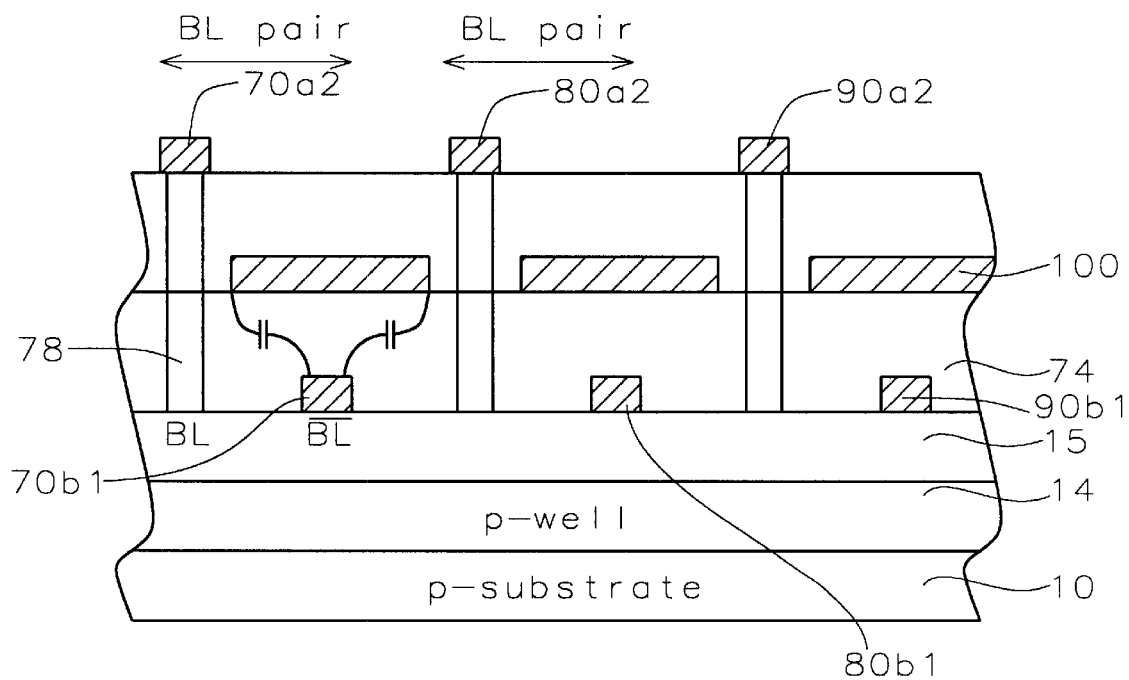

FIG. 9C illustrates the insertion of an additional metal layer 100 between bit-lines in the third embodiment scheme. Bit-line segments 70b1, 80b1, and 90b1 are fabricated in a low metal layer (e.g. metal-1) while bit-line segments 70a2, 80a2, and 90a2 are fabricated in a high metal layer (e.g. metal-3). The intervening metal line 100 in layer metal-2 provides a shielding layer to eliminate both intra- and inter-bit-line coupling; for example, between 70a2 and 70b1 and between 70b1 and 80a2.

In all cases, FIGS. 9A, 9B, and 9C, the capacitance to ground increases somewhat as a trade-off. The total bit-line capacitance may or may not increase compared to the conventional bit-line interconnection since the slightly increased capacitance to the shielding layer may be offset by the reduction of bit-line coupling capacitance.

The techniques of the present invention can be used for stand-alone (or commodity) DRAM with CUB cell at the cost of additional metal layers. The additional metal layers are virtually "free" in embedded DRAM technology. The DRAM stack with COB cannot use the techniques of the present invention for reducing bit-line coupling noises since its bit-line is fabricated earlier than the capacitor.

The process of the present invention provides methods for forming bit-lines in a DRAM cell with CUB. In these methods, bit-lines are fabricated in an alternating manner at multiple metal levels, thus reducing intra- and inter-bit-line capacitance coupling. The bit-line coupling can be eliminated further by inserting a metal shielding layer between bit-lines.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a DRAM with capacitor under bit-line (CUB) cell in an integrated circuit device comprising:

providing word-lines on a semiconductor substrate and a capacitor node contact junction and a plurality of bit-line junctions in said semiconductor substrate between said word-lines;

forming a capacitor connected to said capacitor node contact junction by a contact plug through a first insulating layer;

depositing a second insulating layer overlying said capacitor;

forming a plurality of metal plugs through said second and first insulating layers each contacting one of said plurality of bit-line junctions; and forming bit-lines each contacting one of said plurality of metal plugs wherein a pair of bit-lines consists of two bit-lines horizontally adjacent to each other wherein a first pair of bit-lines is fabricated in a first metal layer overlying said second insulating layer and wherein a second pair of bit-lines is fabricated in a second metal layer separated from said first metal layer by a third insulating layer and wherein said second pair of bit-lines contacts said one of said metal plugs by a via plug through said third insulating layer and wherein said first pair of bit-lines is horizontally spaced from said second pair of bit-lines to complete fabrication of said DRAM with capacitor under bit-line (CUB) cell in said integrated circuit device.

2. The method according to claim 1 wherein said capacitor is a stacked capacitor.

3. The method according to claim 1 further comprising forming word-lines overlying said semiconductor substrate adjacent to said capacitor node contact and said bit-line contacts.

4. The method according to claim 3 wherein said word-lines comprise polycide.

5. The method according to claim 1 wherein said step of forming said capacitor comprises:

forming a polysilicon bottom electrode having a crown shape;

depositing a capacitor dielectric layer overlying said polysilicon bottom electrode; and depositing and patterning a top electrode layer overlying said capacitor dielectric layer.

6. The method according to claim 1 wherein said second insulating layer comprises silicon oxide having a thickness of between about 1000 and 2000 Angstroms.

7. The method according to claim 1 wherein said bit-lines are selected form one of the group containing tungsten and aluminum.

8. The method according to claim 1 wherein said second metal layer is further separated from said first metal layer by additional alternating insulating layers and metal layers.

9. The method according to claim 1 further comprising forming a shielding metal layer overlying said third insulating layer and underlying a fourth insulating layer underlying said second metal layer wherein said shielding metal layer reduces coupling capacitance between each of said pairs of bit-lines.

10. A method for fabricating a DRAM with capacitor under bit-line (CUB) cell in an integrated circuit device comprising:

providing word-lines on a semiconductor substrate and a capacitor node contact junction and a plurality of bit-line junctions in said semiconductor substrate between said word-lines;

forming a capacitor connected to said capacitor node contact junction by a contact plug through a first insulating layer;

depositing a second insulating layer overlying said capacitor;

forming a plurality of metal plugs through said second and first insulating layers each contacting one of said plurality of bit-line junctions; and forming bit-lines each contacting one of said plurality of metal plugs wherein a first of each pair of bit-lines is fabricated in a first metal layer overlying said second insulating layer and wherein a second of each pair of bit-lines is fabricated in a second metal layer separated from said first metal layer by a third insulating layer and wherein said second of each pair of bit-lines contacts said one of said metal plugs by a via plug through said third insulating layer and wherein said first of each pair of bit-lines is horizontally spaced from said second of each pair of bit-lines to complete fabrication of said DRAM with capacitor under bit-line (CUB) cell in said integrated circuit device.

11. The method according to claim 10 wherein said capacitor is a stacked capacitor.

12. The method according to claim 10 wherein said word-lines comprise polycide.

13. The method according to claim 10 wherein said step of forming said capacitor comprises:

forming a polysilicon bottom electrode having a crown shape;

depositing a capacitor dielectric layer overlying said polysilicon bottom electrode; and depositing and patterning a top electrode layer overlying said capacitor dielectric layer.

14. The method according to claim 10 wherein said second insulating layer comprises silicon oxide having a thickness of between about 1000 and 2000 Angstroms.

15. The method according to claim 10 wherein said bit-lines are selected form one of the group containing tungsten and aluminum.

16. The method according to claim 10 wherein said second metal layer is further separated from said first metal layer by additional alternating insulating layers and metal layers.

17. The method according to claim 10 further comprising forming a shielding metal layer overlying said third insulating layer and underlying a fourth insulating layer underlying said second metal layer wherein said shielding metal layer reduces coupling capacitance between each of said pairs of bit-lines and between said first and second of each pair of bit-lines.

18. A method for fabricating a DRAM with capacitor under bit-line (CUB) cell in an integrated circuit device comprising:

providing word-lines on a semiconductor substrate and a capacitor node contact junction and a plurality of bit-line junctions in said semiconductor substrate between said word-lines;

forming a capacitor connected to said capacitor node contact junction by a contact plug through a first insulating layer;

depositing a second insulating layer overlying said capacitor;

forming a plurality of metal plugs through said second and first insulating layers each contacting one of said plurality of bit-line junctions; and forming bit-lines each contacting one of said plurality of metal plugs wherein each bit-line is divided into segments and wherein first segments of a bit-line are fabricated in a first metal layer overlying said second insulating layer and wherein alternating segments of said bit-line are fabricated in a second metal layer separated from said first metal layer by a third insulating layer and wherein for each pair of bit-lines, facing segments of a first and second of said bit-line pair are fabricated in different metal layers and wherein said segments of each bit-line in said second metal layer contact said one of said metal plugs by a via plug through said third insulating layer and wherein said first of each pair of bit-lines is horizontally spaced from said second of each pair of bit-lines to complete fabrication of said DRAM with capacitor under bit-line (CUB) cell in said integrated circuit device.

19. The method according to claim 18 wherein said capacitor is a stacked capacitor.

20. The method according to claim 18 wherein said word-lines comprise polycide.

21. The method according to claim 18 wherein said step of forming said capacitor comprises:

forming a polysilicon bottom electrode having a crown shape;

depositing a capacitor dielectric layer overlying said polysilicon bottom electrode; and depositing and patterning a top electrode layer overlying said capacitor dielectric layer.

22. The method according to claim 18 wherein said second insulating layer comprises silicon oxide having a thickness of between about 1000 and 2000 Angstroms.

23. The method according to claim 18 wherein said bit-lines are selected form one of the group containing tungsten and aluminum.

24. The method according to claim 18 wherein said second metal layer is further separated from said first metal layer by additional alternating insulating layers and metal layers.

25. The method according to claim 18 further comprising forming a shielding metal layer overlying said third insulating layer and underlying a fourth insulating layer underlying said second metal layer wherein said shielding metal layer reduces coupling capacitance between each of said pairs of bit-lines and between said first and second of each pair of bit-lines.

* * * * *